(12) United States Patent
Frederick et al.

(10) Patent No.: US 8,438,522 B1
(45) Date of Patent: May 7, 2013

(54) LOGIC ELEMENT ARCHITECTURE FOR GENERIC LOGIC CHAINS IN PROGRAMMABLE DEVICES

(75) Inventors: Michael T. Frederick, Colorado Springs, CO (US); Arun K. Somani, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 904 days.

(21) Appl. No.: 12/237,076

(22) Filed: Sep. 24, 2008

(51) Int. Cl.
*G06F 17/50* (2006.01)

(52) U.S. Cl.
USPC .......................... 716/117; 716/121; 716/128

(58) Field of Classification Search .................. 716/117, 716/121, 128
See application file for complete search history.

(56) References Cited

U.S. PATENT DOCUMENTS

| | | | |
|---|---|---|---|
| 3,230,355 A | 1/1966 | Chu |
| 3,296,426 A | 1/1967 | Ball |
| 3,313,926 A | 4/1967 | Minnick |
| 3,400,379 A | 9/1968 | Harman |
| 3,566,153 A | 2/1971 | Spencer, Jr. |
| 3,702,985 A | 11/1972 | Proebsting |
| 3,731,073 A | 5/1973 | Moylan |
| 3,803,587 A | 4/1974 | Mead |
| 3,816,725 A | 6/1974 | Greer |
| 3,818,203 A | 6/1974 | Perlowski et al. |
| 3,849,638 A | 11/1974 | Greer |
| 3,912,914 A | 10/1975 | Moylan |
| 3,936,812 A | 2/1976 | Cox et al. |
| 3,974,366 A | 8/1976 | Hebenstreit |
| 3,975,623 A | 8/1976 | Weinberger |
| 3,983,538 A | 9/1976 | Jones |
| 3,987,286 A | 10/1976 | Muehldorf |
| 3,987,287 A | 10/1976 | Cox et al. |
| 4,029,970 A | 6/1977 | Hong et al. |
| 4,032,894 A | 6/1977 | Williams |
| 4,034,356 A | 7/1977 | Howley et al. |
| 4,037,089 A | 7/1977 | Horninger |
| 4,041,459 A | 8/1977 | Horninger |
| 4,051,358 A | 9/1977 | Schwartz |
| 4,056,807 A | 11/1977 | Thornber |
| 4,124,899 A | 11/1978 | Birkner et al. |
| 4,140,921 A | 2/1979 | Balasubramanian et al. |
| 4,195,352 A | 3/1980 | Tu et al. |
| 4,207,556 A | 6/1980 | Sugiyama et al. |
| 4,233,667 A | 11/1980 | Devine et al. |
| 4,237,542 A | 12/1980 | Cukier |
| 4,249,246 A | 2/1981 | Nanya et al. |
| 4,293,783 A | 10/1981 | Patil |

(Continued)

OTHER PUBLICATIONS

Cong, Jason, "FlowMap: An Optimal Technology Mapping Algorithm for Delay Optimization in Lookup-Table Based FPGA Designs", IEEE Transactions on Computer-Aided Design of Integrated Circuits and Systems, vol. 13, No. 1, Jan. 1994, pp. 1-12.

(Continued)

*Primary Examiner* — Vuthe Siek
*Assistant Examiner* — Mohammed Alam
(74) *Attorney, Agent, or Firm* — McKee, Voorhees & Sease, P.L.C.

(57) ABSTRACT

A reconfigurable device includes an arrangement of a plurality of cells and routing resources for transmitting signals between the cells. The plurality of cells comprises carry-select reuse cells, each of the carry-select reuse cells configured to provide for performing non-arithmetic operations using a reuse arithmetic carry chain interconnecting adjacent cells.

14 Claims, 8 Drawing Sheets

U.S. PATENT DOCUMENTS

| | | |
|---|---|---|
| 4,336,601 A | 6/1982 | Tanaka |
| 4,348,736 A | 9/1982 | Weinberger |
| 4,380,811 A | 4/1983 | Gotze et al. |
| 4,395,646 A | 7/1983 | Cases et al. |
| 4,399,516 A | 8/1983 | Blahut et al. |
| 4,409,499 A | 10/1983 | Zapisek et al. |
| 4,415,818 A | 11/1983 | Ogawa et al. |
| 4,429,238 A | 1/1984 | Harrison |
| 4,433,331 A | 2/1984 | Kollaritsch |
| 4,468,735 A | 8/1984 | Gotze et al. |
| 4,488,246 A | 12/1984 | Brice |
| 4,490,812 A | 12/1984 | Guterman |
| 4,495,590 A | 1/1985 | Mitchell, Jr. |
| 4,500,800 A | 2/1985 | Cases et al. |
| 4,501,977 A | 2/1985 | Koike |
| 4,504,904 A | 3/1985 | Moore et al. |
| 4,506,173 A | 3/1985 | Yum |
| 4,506,341 A | 3/1985 | Kalter et al. |
| 4,508,977 A | 4/1985 | Page et al. |
| 4,511,812 A | 4/1985 | Satake |
| 4,514,650 A | 4/1985 | Yum |
| 4,516,040 A | 5/1985 | Zapisek et al. |
| 4,525,641 A | 6/1985 | Cruz et al. |
| 4,534,008 A | 8/1985 | Fuchs et al. |
| 4,546,273 A | 10/1985 | Osman |
| 4,551,814 A | 11/1985 | Moore et al. |
| 4,551,815 A | 11/1985 | Moore et al. |
| 4,554,640 A | 11/1985 | Wong et al. |
| 4,578,771 A | 3/1986 | O'Hara, Jr. |
| 4,580,215 A | 4/1986 | Morton |
| 4,583,012 A | 4/1986 | Smith et al. |
| 4,609,986 A | 9/1986 | Hartmann et al. |
| 4,617,479 A | 10/1986 | Hartmann et al. |
| 4,645,953 A | 2/1987 | Wong |
| 4,659,947 A | 4/1987 | Ogura et al. |
| 4,659,948 A | 4/1987 | Sunter et al. |
| 4,660,171 A | 4/1987 | Moore et al. |
| 4,661,922 A | 4/1987 | Thierbach |
| 4,675,556 A | 6/1987 | Bazes |
| 4,677,318 A | 6/1987 | Veenstra |
| 4,697,105 A | 9/1987 | Moy |
| 4,703,206 A | 10/1987 | Cavlan |
| 4,717,844 A | 1/1988 | Shima et al. |
| 4,730,130 A | 3/1988 | Baskett |
| 4,740,721 A | 4/1988 | Chung et al. |
| 4,742,252 A | 5/1988 | Agrawal |
| 4,745,573 A | 5/1988 | Lebel |
| 4,745,579 A | 5/1988 | Mead et al. |
| 4,758,746 A | 7/1988 | Birkner et al. |
| 4,758,747 A | 7/1988 | Young et al. |
| 4,758,985 A | 7/1988 | Carter |
| 4,761,570 A | 8/1988 | Williams |
| 4,763,020 A | 8/1988 | Takata et al. |
| 4,772,811 A | 9/1988 | Fujioka et al. |
| 4,774,421 A | 9/1988 | Hartmann et al. |
| 4,786,904 A | 11/1988 | Graham, III et al. |
| 4,796,229 A | 1/1989 | Greer, Jr. et al. |
| 4,815,022 A | 3/1989 | Glaeser et al. |
| 4,818,902 A | 4/1989 | Brockmann |
| 4,831,285 A | 5/1989 | Gaiser |
| 4,831,573 A | 5/1989 | Norman |
| 4,839,539 A | 6/1989 | Takata et al. |
| 4,858,178 A | 8/1989 | Breuninger |
| 4,860,235 A | 8/1989 | Kondou et al. |
| 4,870,302 A | 9/1989 | Freeman |
| 4,876,466 A | 10/1989 | Kondou et al. |
| 4,906,870 A | 3/1990 | Gongwer |
| 4,918,641 A | 4/1990 | Jigour et al. |
| 4,931,671 A | 6/1990 | Agrawal |
| 4,937,475 A | 6/1990 | Rhodes et al. |
| 4,942,319 A | 7/1990 | Pickett et al. |
| 4,963,770 A | 10/1990 | Agrawal et al. |
| 4,965,472 A | 10/1990 | Anderson |
| 4,972,105 A | 11/1990 | Burton et al. |
| 5,015,884 A | 5/1991 | Agrawal et al. |
| 5,033,017 A | 7/1991 | Taniai et al. |
| 5,046,035 A | 9/1991 | Jigour et al. |
| 5,053,647 A | 10/1991 | Shizukuishi et al. |
| 5,075,576 A | 12/1991 | Cavlan |
| 5,168,177 A | 12/1992 | Shankar et al. |
| 5,204,555 A | 4/1993 | Graham et al. |
| 5,210,448 A | 5/1993 | Takata |
| 5,212,652 A | 5/1993 | Agrawal et al. |
| 5,231,588 A | 7/1993 | Agrawal et al. |
| 5,233,539 A | 8/1993 | Agrawal et al. |
| 5,302,865 A | 4/1994 | Steele et al. |
| 5,329,460 A | 7/1994 | Agrawal et al. |
| 5,359,536 A | 10/1994 | Agrawal et al. |
| 5,381,551 A | 1/1995 | Maeda et al. |
| 5,398,198 A | 3/1995 | Mahant-Shetti et al. |
| 5,457,644 A | 10/1995 | McCollum |
| 5,493,239 A | 2/1996 | Zlotnick |
| 5,530,439 A | 6/1996 | Steele et al. |
| 5,640,106 A | 6/1997 | Erickson et al. |
| 5,642,304 A | 6/1997 | Simpson |
| 5,687,325 A | 11/1997 | Chang |
| 5,742,531 A | 4/1998 | Freidin et al. |
| 5,794,033 A | 8/1998 | Aldebert et al. |
| 5,805,477 A | 9/1998 | Perner |
| 5,844,829 A | 12/1998 | Freidin et al. |
| 5,877,742 A | 3/1999 | Klink |
| 5,877,972 A | 3/1999 | Aoki et al. |
| 5,961,576 A | 10/1999 | Freidin et al. |
| 5,995,988 A | 11/1999 | Freidin et al. |
| 6,038,652 A | 3/2000 | Phillips et al. |
| 6,052,770 A | 4/2000 | Fant |
| 6,065,028 A | 5/2000 | Dhong et al. |
| 6,081,903 A | 6/2000 | Vorbach et al. |
| 6,119,048 A | 9/2000 | Kondo et al. |
| RE37,048 E | 2/2001 | McCollum |
| 6,188,240 B1 | 2/2001 | Nakaya |
| 6,209,077 B1 | 3/2001 | Robertson et al. |
| 6,311,200 B1 | 10/2001 | Hanrahan et al. |
| 6,353,841 B1 | 3/2002 | Marshall et al. |
| 6,404,227 B1 | 6/2002 | Wasson |
| 6,449,628 B1 | 9/2002 | Wasson |
| 6,476,634 B1 | 11/2002 | Bilski |
| 6,539,477 B1 | 3/2003 | Seawright |
| 6,553,395 B2 | 4/2003 | Marshall et al. |
| 6,573,749 B2 | 6/2003 | New et al. |
| 6,625,721 B1 | 9/2003 | Chen |
| 6,704,816 B1 | 3/2004 | Burke |
| 6,732,126 B1 | 5/2004 | Wang |
| 6,754,686 B1 | 6/2004 | Kaviani |
| 6,873,181 B1 * | 3/2005 | Pedersen .................. 326/38 |
| 6,938,223 B2 | 8/2005 | Boppana et al. |
| 7,007,264 B1 | 2/2006 | Baxter |
| 7,047,166 B2 | 5/2006 | Dancea |
| 7,164,288 B2 | 1/2007 | Leijten-Nowak |
| 7,193,433 B1 | 3/2007 | Young |
| 7,196,541 B2 | 3/2007 | Nowak-Leijten |
| 7,205,791 B1 | 4/2007 | Lee et al. |
| 7,240,263 B2 | 7/2007 | Bialas, Jr. et al. |
| 7,663,400 B1 * | 2/2010 | Plants ....................... 326/38 |
| 2001/0049816 A1 * | 12/2001 | Rupp ........................ 716/16 |
| 2006/0005090 A1 * | 1/2006 | Langhammer et al. ....... 714/725 |
| 2006/0091903 A1 * | 5/2006 | Sood ........................ 326/40 |

OTHER PUBLICATIONS

Frederick, Michael T. et al., "Beyond the Arithmetic Constraint: Depth-Optimal Mapping of Logic Chains in LUT-based FPGAs", FPGA '08 Feb. 24-26, 2008, Moneterey, CA, ACM 978-1-59593-934-0/08/02, pp. 37-46.

Frederick, Michael T. et al., "Beyond the Arithmetic Constraint: Depth-Optimal Mapping of Logic Chains in LUT-based FPGAs", Iowa State University, 2008 Dissertation, 167 pages.

Frederick, Michael T. et al., "Multi-Bit Carry Chains for High-Performance Reconfigurable Fabrics", Aug. 2006, Research paper partially supported by NSF grants and the Jerry R. Junkins Endowment at Iowa State University, 6 pages.

Frederick, Michael T. et al., "Non-arithmetic Carry Chains for Reconfigurable Fabrics", IEEE 2007, #1-4244-1258-7/07, pp. 137-143.

* cited by examiner

LOGIC ELEMENT ARCHITECTURE FOR GENERIC LOGIC CHAINS IN PROGRAMMABLE DEVICES

GRANT REFERENCE

This invention was made with government support under Grant No. CCF0311061 awarded by NSF. The government has certain rights in the invention.

FIELD OF THE INVENTION

The present invention relates to reconfigurable fabrics, and more particularly to carry chains used in reconfigurable fabrics.

BACKGROUND OF THE INVENTION

Carry chains in reconfigurable fabrics serve a very important, yet very specific purpose: to facilitate the efficient implementation of arithmetic functions. Carry chains allow arithmetic functions to bypass the performance-costly general routing array. However, if a carry chain is not used for an arithmetic function, it becomes a superfluous adjacent cell interconnection resource. There are several challenges to carry chain reuse for non-arithmetic chains, some architectural, while others are based on tool support. What is needed is a modified cell design that facilitates carry chain reuse.

Therefore, it is a primary object, feature, or advantage of the present invention to improve over the state of the art.

It is a further object, feature, or advantage of the present invention to provide a modified cell design that facilitates carry chain reuse.

It is a still further object, feature, or advantage of the present invention to provide a means of improving design performance at a minimal cost.

Another object, feature, or advantage of the present invention is to provide a means of improving design performance in a manner which is transparent to a designer.

One or more of these and/or other objects, features, or advantages of the present invention will become apparent from the specification and claims that follow.

BRIEF SUMMARY OF THE INVENTION

Commercially available SRAM-based Field Programmable Gate Arrays (FPGAs) have gained traction in the engineering community as a highly flexible and reusable embedded system design tool. FPGAs are also increasingly being incorporated into production designs because their programmability allows the addition of functionality, hardware fixes/upgrades, or fault tolerance by way of scrubbing or elimination of faulty components. Due to their increasing inclusion in deployed systems, the need to fully utilize every architectural resource is imperative so as to close the speed, area, and power consumption gap between FPGAs and ASICs. The carry chain is one resource that has yet to be exploited to its full capacity.

According to one aspect of the present invention, a reconfigurable device includes an arrangement of a plurality of cells and routing resources for transmitting signals between the cells. The plurality of cells comprises carry-select reuse cells, each of the carry-select reuse cells configured to provide for performing non-arithmetic operations reusing an arithmetic carry chain interconnecting adjacent cells.

According to another aspect of the present invention, a reconfigurable device including an arrangement of a plurality of cells and routing resources for transmitting signals between the cells. The plurality of cells comprises carry-select reuse cells, each of the carry-select reuse cells comprising carry chain elements, look up tables, and sequential logic and wherein the carry chain elements being configured to provide for performing non-arithmetic operations reusing an arithmetic carry chain interconnecting adjacent cells.

According to another aspect of the present invention, a device has an architecture which includes an arrangement of a plurality of cells and routing resources for transmitting signals between the cells. The plurality of cells includes carry-select reuse cells, each of the carry-select reuse cells comprising carry chain elements, look up tables, and sequential logic and wherein the carry chain elements being configured to provide for performing arithmetic operations and being further configured for performing non-arithmetic operations reusing an arithmetic carry chain interconnecting adjacent cells.

DETAILED DESCRIPTION OF THE PREFERRED EMBODIMENT

Figure 1:
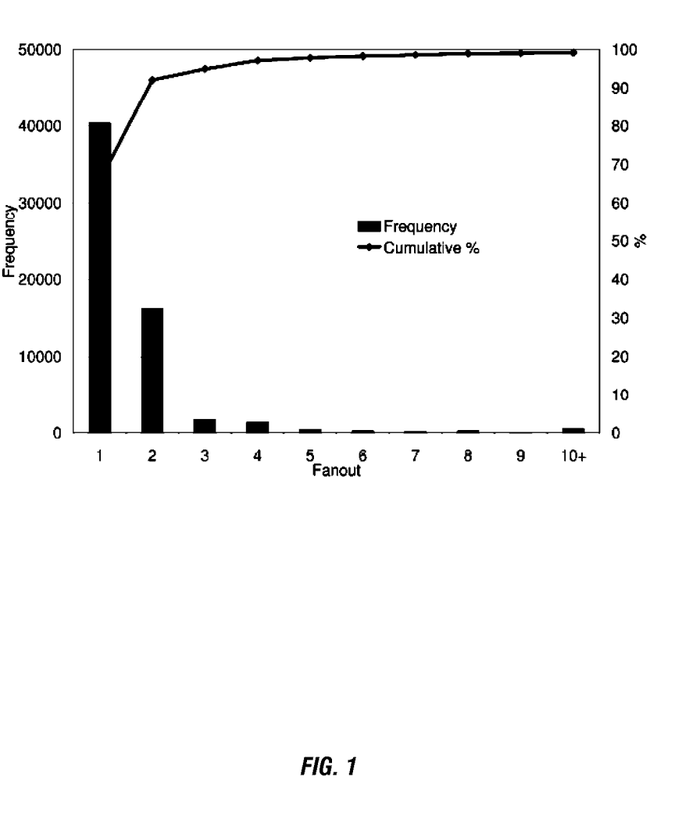
FIG. 1 illustrates distribution of net fanout.

Applications vary greatly from one to another—DSP applications are heavily arithmetic in nature, while many security algorithms are based on Boolean logic and use chains sparingly. For instance, an FFT is dominated by addition and subtraction with 57.6 percent cells in chains, while DES3, despite its complexity, predominately uses tabular look-ups with only 0.8 percent chain cells. FIG. 1 shows an aggregate distribution of net fanout for a sampling of designs available at OpenCores [4]. Greater than 60 percent of the nets in the designs are a direct connection between adjacent logic cells.

Carry chain reuse is defined as a logic chain that has been converted to use the arithmetic chain as a fast interconnect structure between adjacent cells. This forces these cells to be placed next to each other during place and route (PNR), and eliminates the need for that connection to traverse a configurable routing structure. In general, this sampling of designs seems to underutilize carry chains and could possibly benefit from their reuse.

This work presents a modified cell design that facilitates carry chain reuse. Post-technology map experiments show how reuse can benefit all applications. The academic tool flow of SIS [5], ChainMap [7], and VPR [2] is used to measure the effect of chain reuse on routing utilization and maximum clock frequency. The delimiting performance factors are identified and indicate that incorporating tool support into the design flow and making small changes to cell design have the ability to improve design performance at minimal cost and transparently to the designer.

A hardwired connection has been allocated in the Altera Stratix architecture [1] that is capable of connecting LUTs residing in the same block in a chain. This has the advantage of avoiding general routing for Boolean chains of up to 10 LEs, the size of a block in the Stratix architecture. The LUT chain is mapped by Quartus during PNR according to undisclosed metrics. Their functionality is similar to that of the architecture proposed by this work. The major difference between the approaches is that the LUT chain function can be replaced by a reusable carry chain. It is important to note that the Stratix II/III architectures appear to have discontinued the LUT chain.

Figure 4:
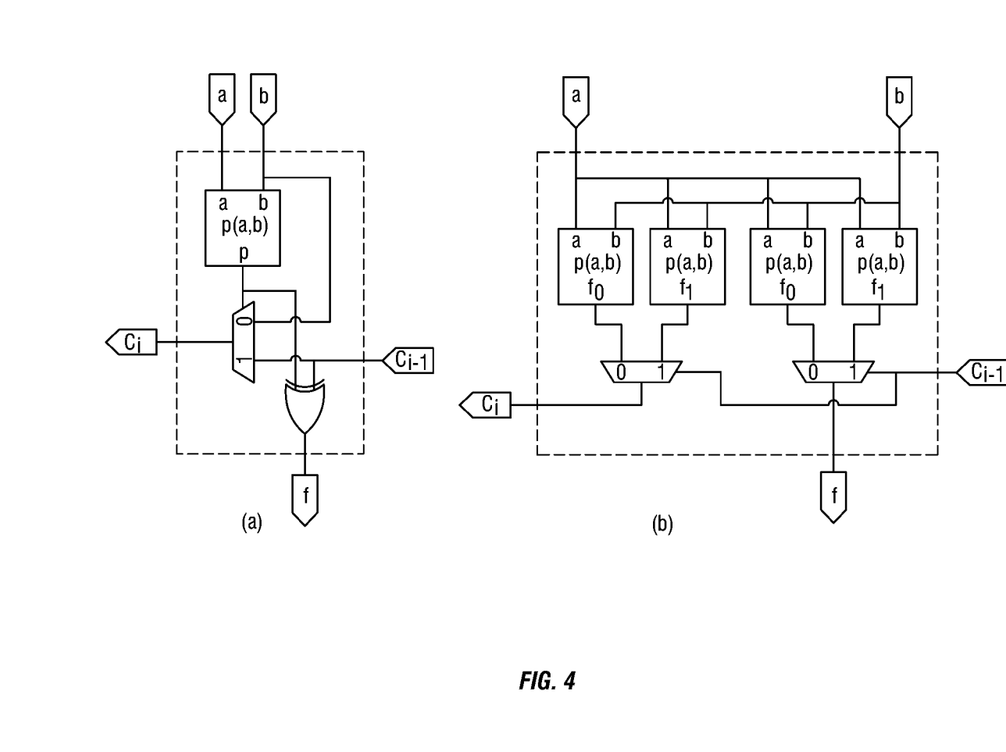
FIG. 4 is a schematic of a propagate-generate and carry-select addition logic.

FPGAs use ripple-carry schemes, or slight variations thereof, for area efficient arithmetic computation. The Xilinx Virtex series FPGAs are prime examples of highly-optimized ripple-carry use in commercial reconfigurable fabrics, using their LUT logic to provide a propagate signal as the selection input of a multiplexer choosing between generate and cell carry-in (cin) [6], as shown in FIG. 4(a). The Altera Stratix also uses ripple-carry as its base carry method, providing for a 2-level chain for Stratix, and parallel ripple-chains with LUT logic and dedicated full adders for the Stratix II [1]. The Stratix is based on the carry-select version of carry computation. Each multiplexer in FIG. 4(b) chooses between precomputed sum (f) and carry out ($c_{i-1}$) based on the cell carry in ($c_{i-1}$). The carry-select scheme in Stratix directly facilitates chain reuse. The carry in to each cell is directly mapped to the selection input of a multiplexer choosing between 2-LUTs. Logically, the carry in serves as the $3^{rd}$ input in a 3-LUT meaning that any LE configured as a 3-LUT can use the native architecture to reuse the carry chain.

This invention is a Stratix-inspired reuse cell design for full-width LUT output. A K-LUT describes the ability of an LUT to implement any K-input Boolean function. Thus, a 4-LUT implements all Boolean operations with 4 inputs. Traditional carry-select based LEs working in random logic (normal) mode implement one K-input, 1-output function, and in arithmetic mode implement two independent (K−1)-input, 1-output functions with K−1 shared inputs. This invention supports the traditional normal and arithmetic modes, and in addition, provides the capability for a K-input, 2-output function.

Tool support for carry chain synthesis is limited. Current software packages, such as Altera Quartus II and Xilinx ISE, identify arithmetic carry chains through high-level HDL macros and primitives. The Xilinx V2P library guide denotes how wide homogeneous Boolean expressions (e.g. 16-input AND) can be formed using the carry chain, but synthesis does not identify and implement all such components, nor are the primitives recognized by ISE v8.2. The only recourse is for the designer to implement such expressions using low level LUT and carry chain primitives. The most common academic synthesis tool, SIS [5] doesn't support arithmetic chains in its internal representation.

Figure 2:
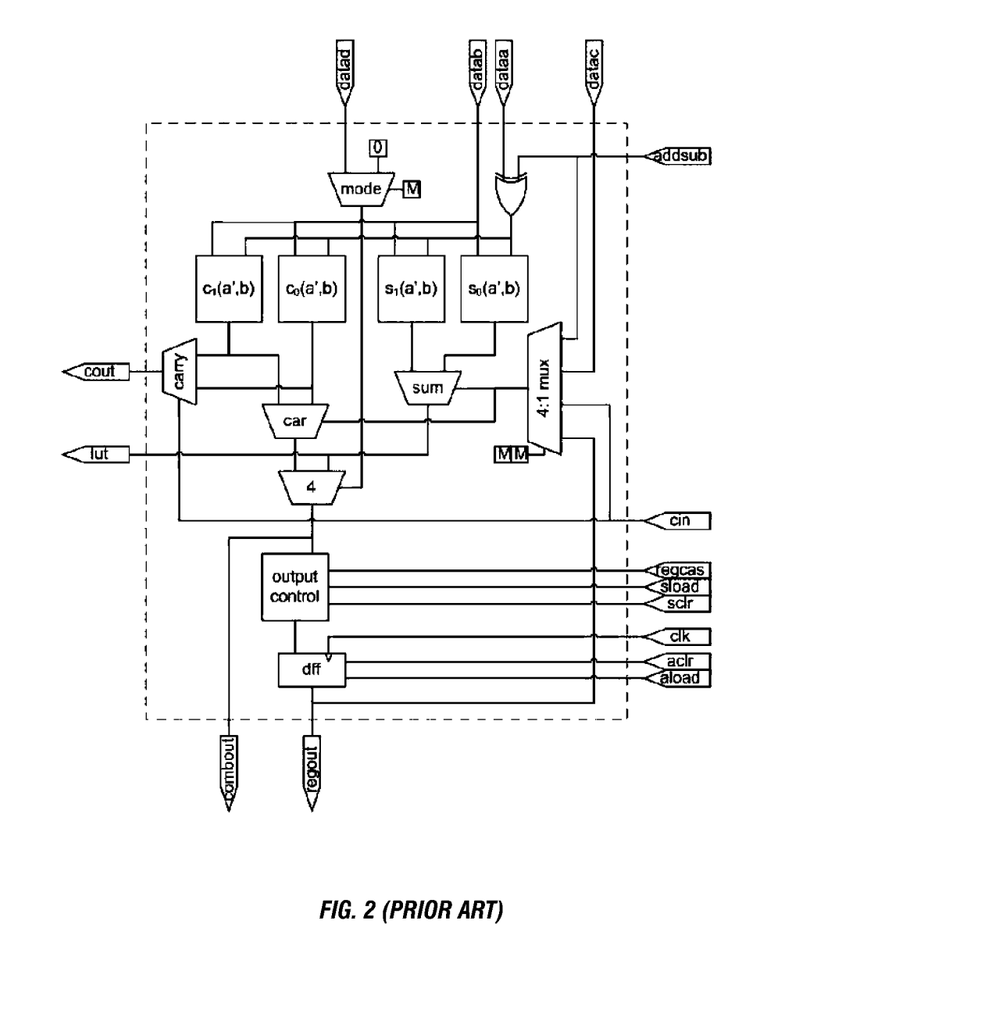
FIG. 2 is a schematic of a carry-select traditional cell.
Figure 3:
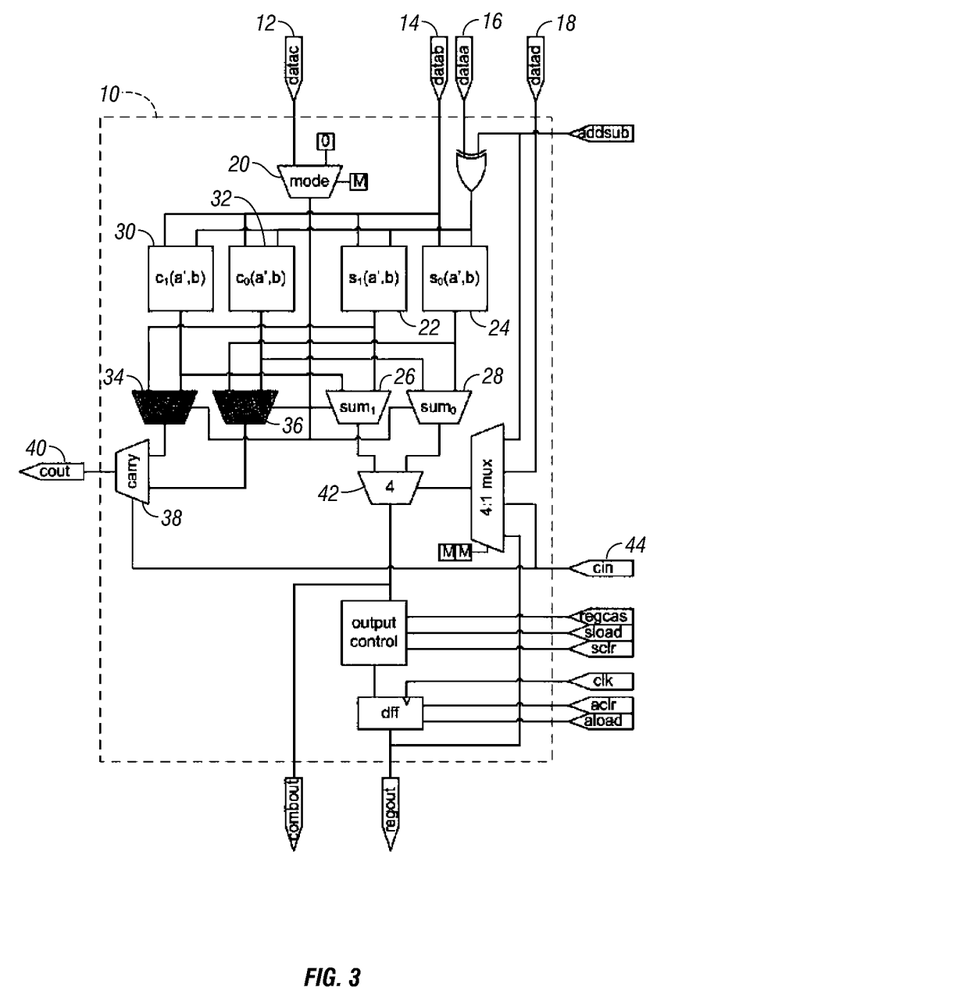
FIG. 3 is a schematic of a carry-select reuse cell.

FIG. 2 shows a rendition of the LE, similar to the stratix_lcell LE primitive, dubbed the traditional cell that will be used as the point of comparison to the reuse architecture depicted in FIG. 3. Several modifications have been made to the traditional cell that preserve its functionality and facilitate chain reuse. In the following description, dataa' will be used to refer to the output of the XOR gate with inputs dataa and addsub, while x will be used to denote an ambiguous component or signal.

Figure 8:
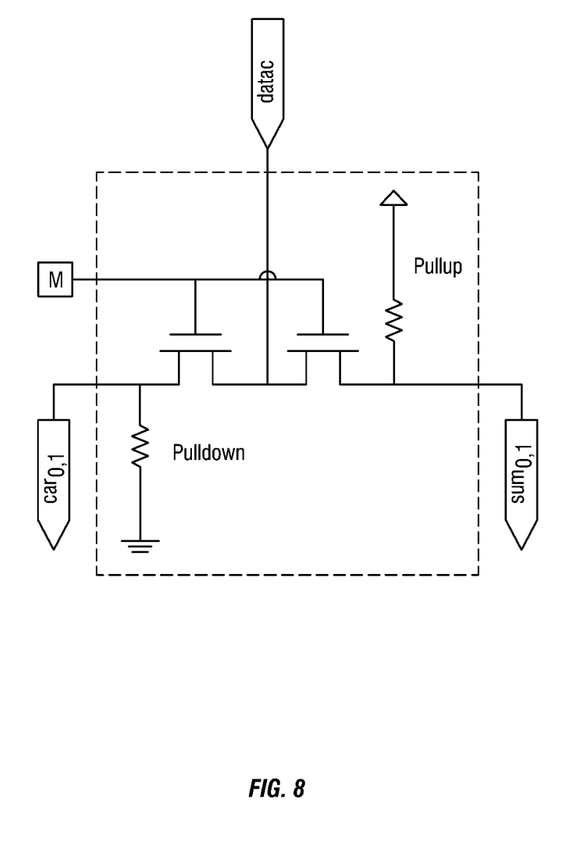
FIG. 8 is a schematic of a static mode output multiplexer.

In FIG. 3, a reuse cell 10 is shown. Data inputs datac 12, datab 14, dataa 16, datad 18, and cin 44 are shown. A mode multiplexer 20 is provided which receives input from datac 12 and may be used to set arithmetic or non-arithmetic mode. A possible implementation of multiplexer 20 is shown in FIG. 8. LUTs $s_1$ 22 and $s_0$ 24 are shown, and serve the role of computing the traditional arithmetic sum for the cases when the carry in 44 is a binary 1 or 0. Sum multiplexers 26, 28 are provided and multiplexer 4 is used to compute a sum. Carry chain elements are also shown. LUTs $c_1$ 30 and $c_0$ 32 serve the role of computing the traditional arithmetic sum for the cases when the carry in cin 44 is a binary 1 or 0, and pass results through multiplexers $car_1$ 34 and $car_0$ 36. A carry multiplexer 38 is also shown which provides the carry output cout 40.

In arithmetic mode, the traditional cell computes the sum of dataa' and datab using LUTs $s_1$ and $s_0$ and the sum multiplexer, whose result is passed through multiplexer 4. The reuse cell on the other hand, passes each of the sum LUT values through a level of multiplexers and uses 42 (multiplexer 4) to compute sum. This is functionally equivalent when the mode multiplexer is set in arithmetic mode (i.e. static output). Similarly, carry computation is performed after allowing the LUT results to pass through multiplexers $car_1$ 34 and $car_0$ 36. Like the traditional design, carry computation is completed once the carry in to the cell is available. The additional level of multiplexing in the reuse design institutes a delay on the carry once dataa' and datab 14 become available. Only the first cell in a carry chain is affected because it is the only one dependent on the arrival of routing inputs. It is assumed that in an synchronous design all routing inputs become available at the same time, causing the carry chain to be the critical path of the circuit. All cells in the chain, with the exception of the first, have computed the carry for both cin conditions before the arrival of cin to the carry multiplexer 38. The sum computation expects identical latency, while the carry latency only differs for the first cell in a chain. Arithmetic mode preserves cout=f(dataa', datab, cin).

The normal operating mode of both cells is appreciably different. In the traditional cell the mode multiplexer passes routing input datad to multiplexer 4, while the reuse cell the mode multiplexer 20 passes datac to the $car_x$ (34, 36) and $sum_x$ (26, 28) multiplexers—a slight difference allowing the cout=f(dataa', datab, datac, cin) for non-arithmetic chains. The combout function is computed similarly in both cell designs, the difference being that the LUT mask is rearranged in the reuse cell. In arithmetic mode the carry and sum LUT outputs must pass through the $car_x$ (34, 36) and $sum_x$ (26, 28) multiplexers without performing a computation, which causes the middle nibbles of the 4-LUT mask to be interchanged in normal mode, as presented in the reuse mask in Table 3 and the traditional mask in Table 4. This is an innocuous change easily dealt with at the technology mapping stage. In summary, no extra delays are introduced in the reuse cell for Boolean operations, the cout can accommodate a f(dataa', datab, datac, cin), and the combout can be the same function as the traditional cell of three general inputs and an input from the 4:1 multiplexer. The 4:1 multiplexer options include an external data input, datax, cin, the register feedback of the cell, regout, and addsub. The only functionality difference between the two cells is the value of datax (datad for reuse, datac for traditional).

TABLE 3

| inputs | | | normal | | arithmetic | |
|---|---|---|---|---|---|---|
| cin/datad 44/18 | datac 12 | datab 14, data 16 | comb-out | cout 40 | comb-out | cout 40 |
| 0 | 0 | xx | $c_0$ 32 | $c_0$ 32 | $s_0$ 24 | $c_0$ 32 |
| 0 | 1 | xx | $s_0$ 24 | $s_0$ 24 | $s_0$ 24 | $c_0$ 32 |

TABLE 3-continued

| inputs | | | normal | | arithmetic | |
|---|---|---|---|---|---|---|
| cin/datad 44/18 | datac 12 | datab 14, data 16 | comb-out | cout 40 | comb-out | cout 40 |
| 1 | 0 | xx | $c_1$ 30 | $c_1$ 30 | $s_1$ 22 | $c_1$ 30 |
| 1 | 1 | xx | $s_1$ 22 | $s_1$ 22 | $s_1$ 22 | $c_1$ 30 |

TABLE 4

| inputs | | | normal | | arithmetic | |
|---|---|---|---|---|---|---|
| datad 18 | cin/datac 44/12 | datab 14, data 16 | comb-out | cout 40 | comb-out | cout 40 |
| 0 | 0 | xx | $s_0$ 24 | $c_0$ 32 | $s_0$ 24 | $c_0$ 32 |
| 0 | 1 | xx | $s_1$ 22 | $c_1$ 30 | $s_1$ 22 | $c_1$ 30 |
| 1 | 0 | xx | $c_0$ 32 | $c_0$ 32 | $s_0$ 24 | $c_0$ 32 |
| 1 | 1 | xx | $c_1$ 30 | $c_1$ 30 | $s_1$ 22 | $c_1$ 30 |

Custom circuit layout and simulation results for the reuse and traditional cell in Table 1 indicate that $cout_0$, the initial cell in a chain, and the combout for all cells both suffer a 1.01x delay at 3.3 v 0.6 μm process technology. Intermediate cells, $cout_{n-1,1}$, experience no increase in delay. R:T gives the ratio of the reuse cell delay and area to that of the traditional cell.

TABLE 1

| | μm × μm | $cout_0$ | $cout_{n-1,1}$ | combout |
|---|---|---|---|---|
| Reuse | 97.95 × 82.35 | 6.04 ns | 3.50 ns | 5.94 ns |
| Trad | 97.95 × 79.95 | 6.01 ns | 3.49 ns | 5.90 ns |
| R:T | 1.03 | 1.01 | 1.00 | 1.01 |

A caveat of this work is that the layout results obtained are not necessarily representative of commercial cell implementations. The assumptions are that the traditional and reuse cell designs have been treated equally and that the performance of the reuse cell relative to the traditional cell can be adequately estimated by assessing an overall performance penalty when applicable. It is applicable during the first cout computation in a chain and the combout of every cell in the design. In the overall cell layout, area is dominated by the 20 SRAM configuration bits, D flip-flop, pass transistor 4-LUT structure, and the output control. In this context, the two additional 2:1 pass transistor multiplexers of the reuse cell yield a 1.03x area increase.

Combining this invention with a generic logic chain assignment method such as that presented in [7] allows FPGA LEs to have equal access to the fast chain resources ubiquitous in today's commercial architectures. In experiments presented in [8], HDL chains are preserved through synthesis and technology mapping (after, normal), through only synthesis (before), and not preserved (forget). Each circuit is mapped to an FPGA with the minimum amount of component and routing resources required for implementation. LUT widths of 4, 5, and 6 inputs are tested.

Figure 5:
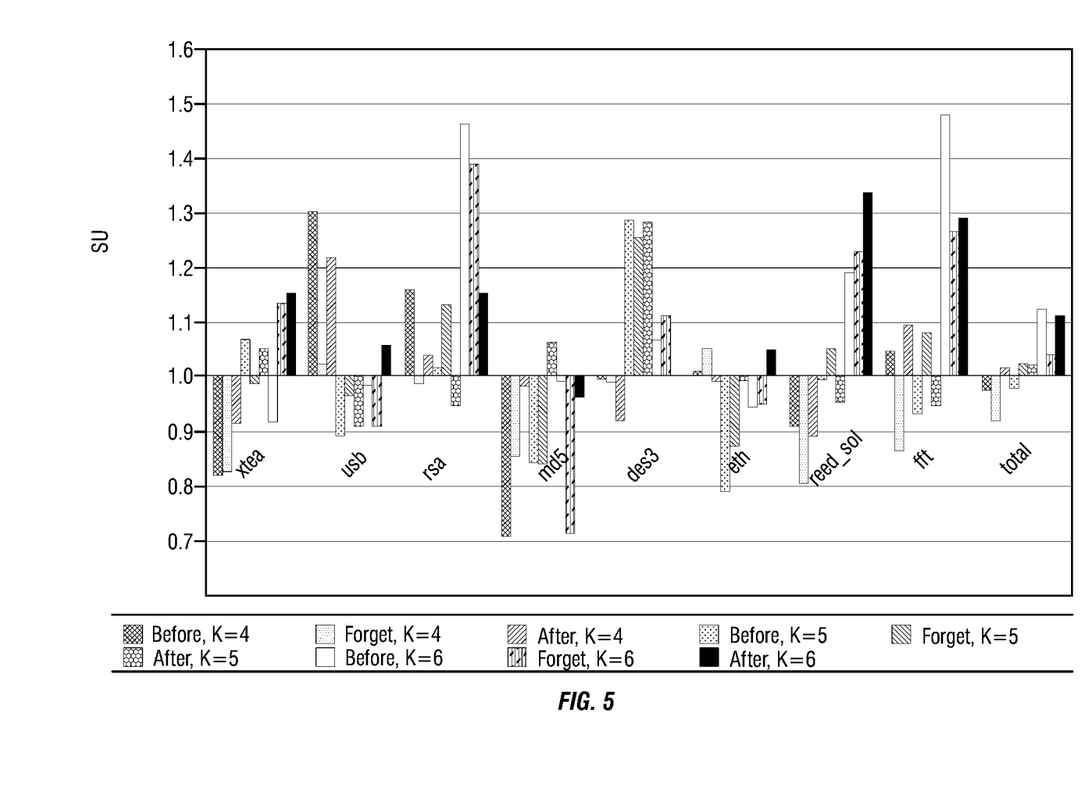
FIG. 5 is a graph illustrating speedup of reuse flows over unmodified flow for LUT of 4, 5, and 6 inputs.

Speedup is defined as the ratio of the critical path delay of the reuse cell to that of traditional cell; higher speedup indicates a performance increase for the reuse cell. The effect of this invention on the average speedup of circuits, as depicted in FIG. 5, is approximately 1.05x, with a minimum of 0.73x and maximum of 1.45x witnessed. Increasing the width of the LUT, the current trend in commercial architectures, generally yields higher performance increases for the reuse cell.

Figure 6:
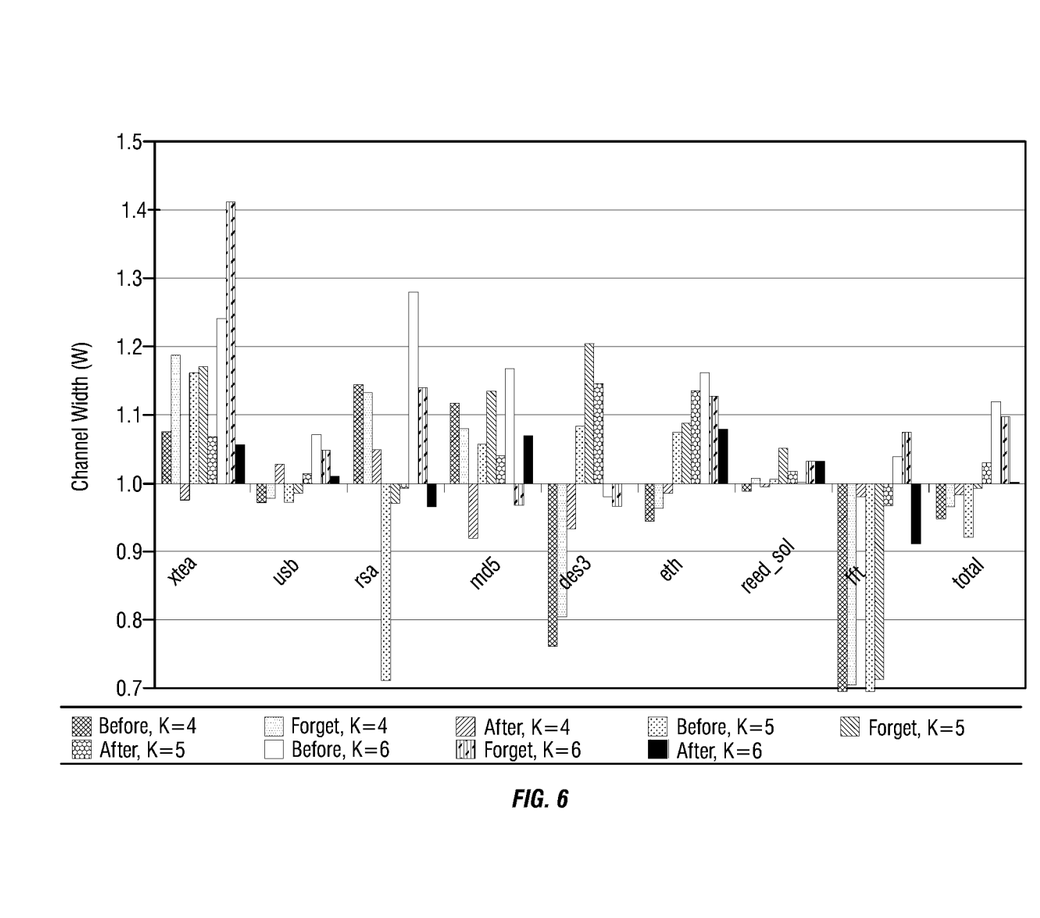
FIG. 6 is a graph illustrating required FPGA channel width of reuse flows over unmodified flow for LUT of 4, 5, and 6 inputs.

The change in channel width is defined as the ratio of the channel width of the reuse cell to that of the traditional cell; higher channel width ratio indicates a performance decrease for the reuse cell. FIG. 6 indicates that an increase in speedup for the reuse cell often comes at the cost of an increase in the FPGAs required channel width. The average change in channel width is a 1.05x increase with a minimum of 0.7x and maximum of 1.4x observed. This indicates that an increase in the routing resources of an FPGA is required if performance increases are to be reaped by the invention.

Figure 7:
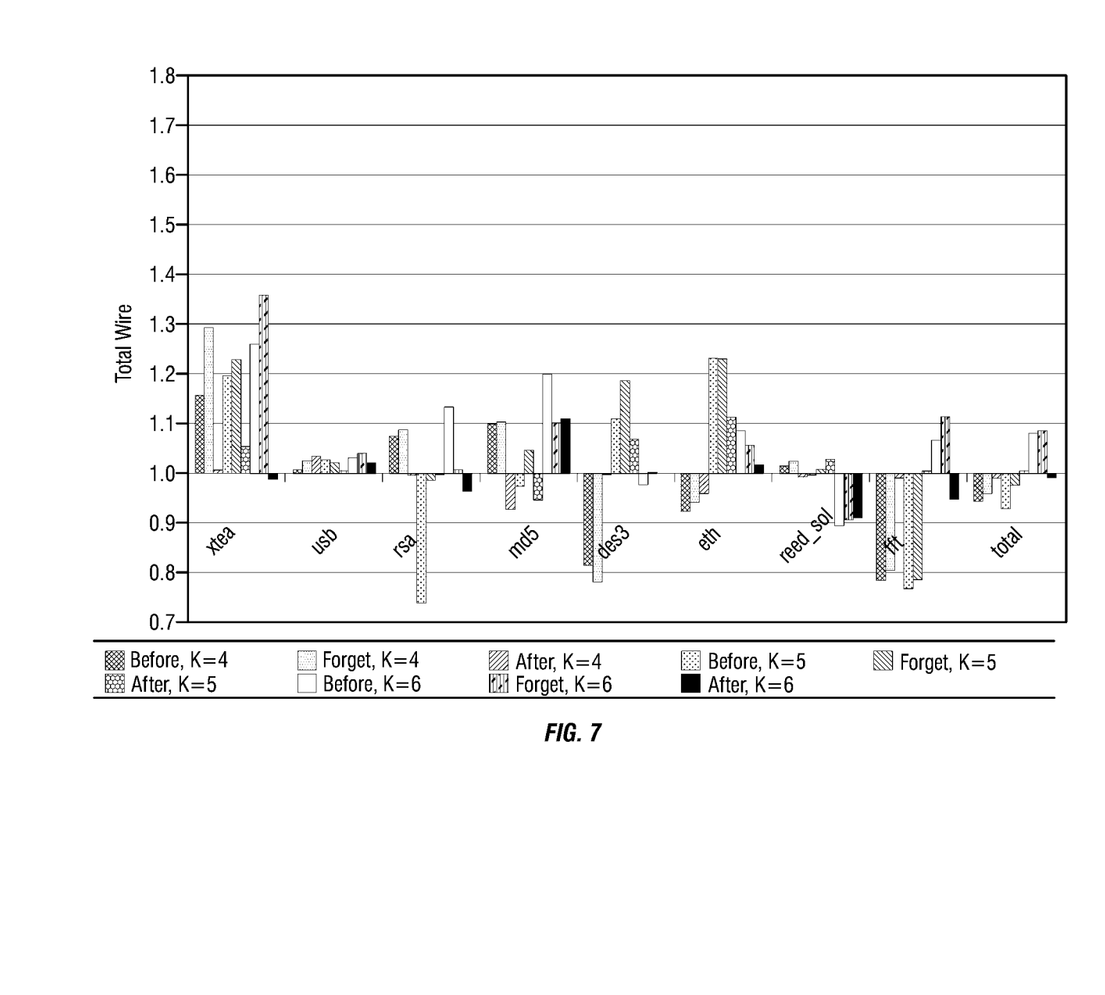
FIG. 7 is a graph illustrating total routed wire length for reuse flows over unmodified flow for LUT of 4, 5, and 6 inputs.

The change in total routed wire length is defined as the ratio of the total routed wire length of the reuse cell to that of the traditional cell; higher total routed wire length ratio indicates a performance decrease for the reuse cell. FIG. 7 indicates that an increase in speedup for the reuse cell often comes at the cost of a small increase in the FPGAs required total routed wire length. The average change in total wire is neutral, at 1.0x, with a minimum of 0.78x and maximum of 1.35x observed. This indicates that this invention more completely uses the routing resources offered by an FPGA.

The present invention provides a way to reuse arithmetic carry chains in FPGAs to offer benefits to non-arithmetic operations. A modified cell architecture based on the carry-select ripple chain is presented and shown to increase delay through the cell by 1.01x and increase utilization by 1.03x. Traditional functionality is preserved at minimum cost, and the added delay in the carry chain is only an issue at the first cell in a chain. The result is an architecture that is able to pass its full K-LUT value along the carry chain. To study the effect of chain reuse for a commercial design tool and architecture, the chain assignment technique presented in [7] and the rest of the academic design flow were used by [8] for four separate strategies of treating HDL based arithmetic chains. Speedup, channel width ratio, and total routed wire length ratio results indicate that circuits can benefit from this invention's inclusion in commercial FPGA architectures. While some circuits often simultaneously increase performance and decrease routing consumption, others may do quite the opposite. The success of the invention in a particular application may depend on the characteristics exhibited by the design, such as number of arithmetic chain cells, number of cells in the design, the average fanout of each net, and, most importantly, the chain assignment algorithm chosen.

Logic chains may use the carry chain as a 0 delay interconnection structure regardless of HDL macros. The post-place and route experiments show chain reuse has great potential based in this invention's ability to obviate the difference between arithmetic and non-arithmetic chains. At a time when FPGA vendors are increasing the width of the LUT from 4 to 5 to 6 inputs and beyond, this invention provides a basis to support chain operations that exceed the minimal requirements of simple arithmetic chains in an efficient and minimally invasive manner. Such support combats the underutilization caused by 3-input arithmetic operations using a 6-input LUT.

Carry chain reuse can be a valuable addition to reconfigurable architectures and their design flow. Results indicate that even with naive algorithms, a design/algorithm pair can be found that can potentially increase maximum clock frequency, with an observed maximum of 1.45x, and decrease routing consumption, with an observed minimum of 0.7x, for the presented circuits. It is another step toward fully harnessing the complete computing capacity of FPGAs.

Therefore a configurable device which was carry chain reuse cells has been disclosed. The present invention contemplates numerous variation options and alternatives within the spirit and scope of the claimed invention.

REFERENCES

All references listed are herein incorporated by reference in their entirety.

[1] Altera. *Stratix Series User Guides*. http://www.altera.com.
[2] V. Betz, J. Rose, and A. Marquardt. *Architecture and CAD for Deep-Submicron FPGAs*. Kluwer, Norwell, Mass., 1999.
[3] S. Malhotra, T. Borer, D. Singh, and S. Brown. The quartus university interface program: enabling advanced fpga research. In *Proceedings of the 2004 IEEE Int'l Conference on Field-Programmable Technology*, pages 225-230, December 2004.
[4] OpenCores. http://www.opencores.org/, 2007.
[5] E. Sentovich et al. Sis: A system for sequential circuit synthesis. Technical Report UCB/ERL M92/41, EECS Department, University of California, Berkeley, 1992.
[6] Xilinx. *Virtex Series User Guides*. http://www.xilinx.com
[7] M. T. Frederick and A. K. Somani. Beyond the arithmetic constraint: depth-optimal mapping of logic chains in LUT-based FPGAs. In *Proceedings of the Sixteenth ACM/SIGDA Int'l Symposium on Field-Programmable Gate Arrays*, pages 37{46, February 2008.
[8] M. T. Frederick. Beyond the arithmetic constraint: depth-optimal mapping of logic chains in reconfigurable fabrics. Iowa State University Dissertation, May 2008.

What is claimed is:

1. A reconfigurable device including: an arrangement of a plurality of cells and routing resources for transmitting signals between the cells, wherein the plurality of cells comprises carry-select reuse cells, each of the carry-select reuse cells configured to provide for performing non-arithmetic operations using a reuse arithmetic carry chain interconnecting adjacent cells when a non-arithmetic mode input is received to provide a non-arithmetic mode and further configured to perform arithmetic operations using the reuse arithmetic carry chain when an arithmetic mode input is received to provide an arithmetic mode, wherein in the arithmetic mode, the carry-select reuse cells provide for two independent (K−1) input, 1-output functions with K−1 shared inputs;
    wherein in the non-arithmetic mode, the carry-select reuse cells provide for one K-input 1-output function;
    wherein the carry-select reuse cells further provide for a K-input, 2-output function; wherein K is a number of inputs of a lookup table associated with the carry select reuse cells.

2. The reconfigurable device of claim 1 wherein the reconfigurable device is a field programmable gate array (FPGA).

3. The reconfigurable device of claim 1 wherein the reuse arithmetic carry chain provides a carry output, the carry output providing an output of a function defined by the carry-select reuse cells for non-arithmetic chains.

4. The reconfigurable device of claim 1 wherein each of the carry-select reuse cells comprises carry chain elements, look up tables, and sequential logic configured to allow the reuse arithmetic carry chain to be used for arithmetic or non-arithmetic operations.

5. The reconfigurable device of claim 1 wherein the arrangement being at least partially determined by applying an algorithm for creating non-arithmetic chains.

6. A reconfigurable device including: an arrangement of a plurality of cells and routing resources for transmitting signals between the cells, wherein the plurality of cells comprises carry-select reuse cells, each of the carry-select reuse cells comprising carry chain elements, look up tables, and sequential logic and wherein the carry chain elements being configured to provide for performing non-arithmetic operations using a reuse arithmetic carry chain interconnecting adjacent cells when a non-arithmetic mode input is received to provide a non-arithmetic mode and further configured to perform arithmetic operations using the carry chain elements when an arithmetic mode input is received to provide an arithmetic mode, wherein in the arithmetic mode, the carry-select reuse cells provide for two independent (K−1) input, 1-output functions with K−1 shared inputs;
    wherein in the non-arithmetic mode, the carry-select reuse cells provide for one K-input, 1-output function;
    wherein the carry-select reuse cells further provide for a K-input, 2-output function; wherein K is a number of inputs of a lookup table associated with the carry select reuse cells.

7. The reconfigurable device of claim 6 wherein the reconfigurable device is a field programmable gate array (FPGA).

8. The reconfigurable device of claim 6 wherein the carry chain elements provide a carry output, the carry output providing an output of a function defined by the carry-select reuse cells for non-arithmetic chains.

9. The reconfigurable device of claim 6 wherein the arrangement being at least partially determined by applying an algorithm for creating non-arithmetic chains.

10. A device having an architecture comprising: an arrangement of a plurality of cells and routing resources for transmitting signals between the cells, wherein the plurality of cells comprises carry-select reuse cells, each of the carry-select reuse cells comprising carry chain elements, look up tables, and sequential logic and wherein the carry chain elements being configured to provide for performing arithmetic operations when an arithmetic mode input is received to provide a non-arithmetic mode and being further configured for performing non-arithmetic operations using a reuse arithmetic carry chain interconnecting adjacent cells when a non-arithmetic mode input is received to provide an arithmetic mode, wherein in the arithmetic mode, the carry-select reuse cells provide for two independent (K−1) input, 1-output functions with K−1 shared inputs;
    wherein in the non-arithmetic mode, the carry-select reuse cells provide for one K-input, 1-output function;
    wherein the carry-select reuse cells further provide for a K-input, 2-output function; wherein K is a number of inputs of a lookup table associated with the carry select reuse cells.

11. The device of claim 10 wherein the device is a field programmable gate array (FPGA).

12. The device of claim 10 wherein the carry chain elements provide a carry output, the carry output providing an output of a function defined by the carry-select reuse cells for non-arithmetic chains.

13. The device of claim 10, wherein in the arithmetic mode, a sum is computed using sum lookup tables, values from the sum lookup tables passing through a level of multiplexers and then an additional multiplexer to compute a sum.

14. The device of claim 13, wherein carry computation is performed after allowing lookup table results to pass through an additional level of multiplexing.

* * * * *